United States Patent
Suzuki

(10) Patent No.: US 8,272,348 B2
(45) Date of Patent: Sep. 25, 2012

(54) METHOD FOR PLASMA DEPOSITION AND PLASMA CVD SYSTEM

(75) Inventor: Masayasu Suzuki, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 175 days.

(21) Appl. No.: 12/811,333

(22) PCT Filed: Feb. 26, 2008

(86) PCT No.: PCT/JP2008/053249
§ 371 (c)(1),
(2), (4) Date: Jun. 30, 2010

(87) PCT Pub. No.: WO2009/107196
PCT Pub. Date: Sep. 3, 2009

(65) Prior Publication Data
US 2010/0285629 A1     Nov. 11, 2010

(30) Foreign Application Priority Data
Feb. 26, 2008  (JP) ............... PCT/JP2008/053249

(51) Int. Cl.
*C23C 16/00* (2006.01)
*C23C 16/50* (2006.01)

(52) U.S. Cl. ........... 118/723 R; 438/788; 438/792; 118/723 E; 118/723 I; 118/723 IR; 257/E21.17

(58) Field of Classification Search ........... 118/723 R, 118/723 E, 723 I, 723 IR; 438/788, 792; 257/E21.17
See application file for complete search history.

(56) References Cited

U.S. PATENT DOCUMENTS

| 6,037,274 A * | 3/2000 | Kudo et al. ............... 438/778 |
| 7,567,037 B2 * | 7/2009 | Setsuhara et al. ....... 315/111.21 |
| 2009/0087586 A1 * | 4/2009 | Takahashi ................ 427/579 |
| 2009/0197101 A1 * | 8/2009 | Nakagame et al. ........ 428/447 |
| 2010/0062183 A1 * | 3/2010 | Fujinami et al. .......... 427/579 |
| 2010/0130018 A1 * | 5/2010 | Tokashiki et al. ......... 438/710 |

FOREIGN PATENT DOCUMENTS

| JP | 2002-110587 | 4/2002 |
| JP | 2004-14494 | 1/2004 |
| JP | 2006-228933 | 8/2006 |
| WO | WO 2004064460 | 7/2004 |

OTHER PUBLICATIONS

International Search Report of International Application No. PCT/JP2008/053249, dated May 22, 2008.

* cited by examiner

*Primary Examiner* — Jarrett Stark
(74) *Attorney, Agent, or Firm* — J.C. Patents

(57) ABSTRACT

In a film-forming process with a capacitively-coupled plasma (CCP) chemical vapor deposition (CVD) device, pulse control is performed on a low-frequency radio-frequency power source. During the pulse control, an ON time and an OFF time form one period. Furthermore, in the pulse control, a time interval between a time period from the moment that the electric power supply is stopped till the electron density decreases to a residual plasma threshold capable of causing an arc discharge and a time period from the moment that the electric power supply is stopped till the density of high-temperature electrons decreases to a specific plasma state serves as the OFF time; a saturation time during the rising process of the density of the high-temperature electrons in the plasma after the electric power supply is started serves as an upper limit of the ON time; and electric power is intermittently supplied under the above conditions.

4 Claims, 11 Drawing Sheets

Energy distribution of electron temperature in glow discharge plasma

METHOD FOR PLASMA DEPOSITION AND PLASMA CVD SYSTEM

BACKGROUND OF THE INVENTION

1. Field of the Invention

The present invention relates to a plasma film-forming method and a plasma chemical vapor deposition (CVD) device capable of forming a thin film on a substrate by using a capacitively-coupled plasma (CCP) CVD technology, in particular, to a film-forming method and a film-forming device for forming a nitride film used in a reflective film of a crystalline solar cell.

2. Description of Related Art

Film-forming devices capable of fabricating a thin film on a substrate already exist. Such a film-forming device is a plasma CVD device, which is used for fabricating thin films for solar cells and various types of semiconductors like a thin-film transistor (TFT) array in a liquid crystal display (LCD).

An in-line plasma CVD device has a load chamber, a reaction chamber, and an unload chamber. In the device, a substrate loaded on a susceptor, such as a tray, is sequentially moved among the load chamber, the reaction chamber, and the unload chamber while being processed, so as to form a thin film thereon. A lamp heater etc. is disposed in the load chamber, and the lamp heater is used for heating the substrate when the substrate is loaded on the tray. Afterwards, the substrate is delivered into a vacuum chamber and then delivered into a film-forming chamber. In the film-forming chamber, one or more types of chemical gases containing elements for composing a thin-film material is introduced and decomposed by using a high-frequency electric-power CCP, so as to form a thin film on the substrate through CVD. Finally, the substrate with the thin film formed thereon is removed from the unload chamber.

FIG. 9 is a diagram exemplifying a configuration of a CVD device having a film-forming chamber and a heating chamber in a vacuum chamber. A CVD device 101 in FIG. 9 includes a preheating chamber 102 (102A, 102B), a film-forming chamber 103 (103A, 103B), and an unload chamber 104 arranged in line. In the device, a substrate 120 loaded on a tray 109 is delivered while being preheated, so as to form a film thereon. Heaters 107 are disposed in the preheating chamber 102 and the film-forming chamber 103.

After a film is formed on the substrate 120 in the film-forming chamber 103, the substrate 120 is guided out of the unload chamber 104, unloaded from the tray 109, and delivered for subsequent process (not shown). Meanwhile, the tray 109 with the substrate 120 unloaded there-from is returned to a substrate transfer device 106 via a tray return belt 105, so that the tray 109 is once again loaded with an unprocessed substrate 120 by the substrate transfer device 106. The loaded tray 109 is then guided into the preheating chamber 102 for the substrate 120 to be processed by the film-forming process.

A gas is introduced into the film-forming chamber 103, and a radio-frequency (RF) electric power that has been impedance-matched in a match box 103c is supplied from an RF power source 103a to a high-frequency electrode 103d, so that a plasma is formed. Previously, the RF power source continuously supplies an RF electric power to the high-frequency electrode.

During the film-forming process of the plasma CVD device, in order to raise the deposition rate, the supplied electric power needs to be increased. However, the increase of the supplied electric power may result in a problem of an increased probability of an abnormal arc discharge.

In the prior art, the following method is mainly adopted to suppress the arc discharge. In order to protect an RF power source, the power source is cut off when an arc discharge occurs, and is restarted after a specified time period has been elapsed. FIGS. 10(a) and 10(b) are diagrams of arc discharge suppression in the prior art. FIG. 10(a) shows a state of an RF reflected power returned from a load to an RF power source, and FIG. 10(b) shows a state of an RF input power input from the RF power source to the load.

Once an arc discharge occurs, the RF reflected power returned from the load to the RF power source is increased. The RF power source detects the RF reflected power, compares the detected RF reflected power with a predetermined threshold, and detects the occurrence of the arc discharge when the RF reflected power exceeds the predetermined threshold (indicated by A in FIG. 10(a)). Upon detecting the occurrence of the arc discharge, the RF power source controls the electric power in the following manner. The RF electric power is stopped from being supplied to the load (indicated by B in FIG. 10(b)) and the electric power is cut off for a specified time period (for example, 0.01 sec) (indicated by C in FIG. 10(b)), so that the arc discharge disappears. Afterwards, the input electric power is gradually increased to reach the predetermined threshold (indicated by D, E in FIG. 10(b)), and the supply of the electric power is thereby resumed.

However, the above control method of detecting the occurrence of arc discharge by monitoring the RF reflected power and cutting off the electric power after the occurrence of the arc discharge has the following problems. As long as an arc discharge occurs at least once, it is impossible to suppress the later occurring arc discharge if the arc discharge does not occurred again; and when an arc discharge occurs again, the electric power control must be performed to cut off the electric power at any time. However, the occurrence of a micro-arc discharge that cannot be observed as a reflected power may not be suppressed.

Furthermore, it has been proposed that waveforms other than an alternating current (AC) waveform may be used in the electric power supply process of the plasma CVD device. For example, it has been proposed that a pulse capable of pulsing a voltage and shortening a voltage rising time is used to replace the AC waveform, so as to facilitate the generation of the plasma.

Moreover, it has been proposed that a supplied pulse voltage may be intermittently cut off before an arc discharge is about to occur, instead of continuously supplying the RF electric power. Hence, the arc discharge is avoided and a stable glow discharge is maintained. Besides, it has been proposed that an arc discharge is prevented by setting an intermittent power supply in which a voltage is stopped from being applied at a proper time interval (referring to Patent Document 1).

In addition, it has been proposed that a pulse electric field is applied between opposite electrodes, so that a raw gas is introduced to form a glow discharge plasma. Thus, in an environment containing no component such as a helium gas that lasts for a long time from a plasma discharge state to an arc discharge state, the discharge is stopped before the occurrence of arc discharge and then the discharge is restarted, so as to generate a stable discharge plasma through such a discharge cycle. Preferably, a rise time (when the voltage (absolute value) continuously rises) and a fall time (when the voltage (absolute value) continuously drops) of the pulse electric field are smaller than or equal to 100 μs; and one pulse duration is smaller than or equal to 200 μs (referring to Patent Document 2).

Patent Document 1: Japanese Patent Publication No. 2004-14494 (Paragraph 0005, Paragraph 0011, and Paragraph 0014)

Patent Document 2: Japanese Patent Publication No. 2002-110587 (Paragraph 0011, Paragraph 0051, and Paragraph 0055)

FIG. 11 is an energy distribution diagram of an electron temperature of a glow discharge plasma. Referring to FIG. 11, for a high-density low-electron-temperature plasma, electrons are distributed at high density in areas of a low electron temperature; whereas for a low-density high-electron-temperature plasma, electrons are distributed at a low density in areas of a high electron temperature. In this case, if frequencies of 13.56 MHz and 250 KHz are being compared, a high-density low-electron-temperature plasma is formed by a plasma CVD device using an RF power source of 13.56 MHz, and a low-density high-electron-temperature plasma is formed by a plasma CVD device using an RF power source of 250 KHz.

In the plasma CVD device using an RF power source having a common industrial frequency, that is, 13.56 MHz, for the glow discharge plasma, even if the electric power is cut off, the plasma may not disappear instantly. Instead, the plasma state is maintained for a time period of about 100 μsec to 150 μsec. Generally, the reason is that, due to the recombination of ions with electrons in the plasma, the disappearance of the diffusion of electrons to the wall and the combining of electrons with neutral gas molecules in the plasma, the plasma density is gradually reduced until it is impossible to maintain the plasma, and thus the plasma disappears.

If the energy supply is cut off, the vibration energy of the electrons instantly disappears, so that energy in the micro amount of high-temperature electrons that possibly causes the arc discharge disappears within a time period much shorter than the reducing time of the overall plasma density.

Therefore, as for the high-density low-electron-temperature plasma, during most of the time within 150 μsec after the electric power is cut off, the low-temperature electrons take up a large proportion in the residual plasma, while the density of the high-temperature electrons is low. Hence, it is difficult to cause an arc discharge in this state.

It is known to all that, when the plasma CVD thin-film forming device is used, an arc discharge is sometimes caused by high-temperature electrons. Therefore, when an RF power source having a frequency greater than or equal to 13.56 MHz is adopted to form a high-density low-electron-temperature plasma, as described in the prior art, the electric power may be cut off to eliminate the high-temperature electrons in the plasma; thus, an arc discharge may be precluded.

When a low-frequency RF power source of about 250 KHz is adopted, the plasma is a low-density high-electron-temperature plasma, so that the electron temperature is distributed at a high temperature range, which may easily cause an arc discharge.

The CCP obtained by using a low-frequency RF power source of about 150 KHz to 600 KHz is generally a low-density high-electron-temperature plasma.

In a CCP-CVD device used for foaming a nitride film of a crystalline solar cell, a CCP for supplying an RF electric power provided by a low-frequency RF power source of about 150 KHz to 600 KHz to an electrode for forming a plasma is adopted. The plasma generally has a low density but a high electron temperature. Referring to FIG. 11, the low-density high-electron-temperature plasma contains high-temperature electrons having high energy, so that an arc discharge may easily occur in this state.

Furthermore, when the nitride film of the crystalline solar cell is formed, the temperature of the substrate in the CVD process is greater than or equal to a high temperature of 400° C., and the obtained nitride film is an insulation film. Further, the electrode has a large area, which is greater than or equal to the area of a square having a side length of 1 m. Hence, an arc discharge is easily resulted during the CVD process.

Therefore, when a CCP device using a low-frequency RF power source is adopted to form the nitride film of the crystalline solar cell, it is considered to be in an environment in which an arc discharge is extremely likely to occur.

During the CVD process, if an arc discharge occurs on the surface of the electrode, on the substrate, near the substrate, inside the film-forming chamber or on the wall of the chamber, it is impossible to produce a uniform thin film. Besides, a large number of particles are generated due to the arc discharge, and the generated particles not only lead to defects of the substrate, but also interrupt the operation of the CVD process itself.

The occurrence of an arc discharge is detected, and the electric power is cut off each time when an arc discharge is detected, so that the arc discharge disappears. In such an arc discharge suppression method in the prior art, the generation of the particles is sometimes inevitable, and the substrate is damaged due to the arc discharge. Moreover, the arc discharge may occur partially, so that the uniformity of the plasma is destroyed, and the uniformity of the thin film cannot be guaranteed. Furthermore, the occurrence of a micro-arc discharge that cannot be observed as a reflected power may not be suppressed.

In addition, as disclosed in Patent Document 1, the arc discharge is prevented by setting an intermittent power supply in which a voltage is stopped from being applied at a proper time interval, but how to select an intermittent time interval for the intermittent power supply is not exemplified. Besides, as exemplified in Patent Document 2, a rise time (when the voltage (absolute value) continuously rises) and a fall time (when the voltage (absolute value) continuously drops) are made to be smaller than or equal to 100 μs. In an example, a certain voltage is applied in a time range of 3 mμs to 200 mμs, but the references for determining the cut-off time or the time for applying a certain voltage are not explicitly described with respect to specific values.

SUMMARY OF THE INVENTION

In order to solve the above problems, the present invention adopts a CCP device using a low-frequency RF power source to form a nitride film of a crystalline solar cell, so as to avoid an arc discharge.

Particularly, in the present invention, before an arc discharge occurs (including the occurrence of a micro-arc discharge that cannot be observed as a reflected power), the generation of high-temperature electrons is periodically suppressed, so as to avoid the arc discharge.

In the present invention, during a film-forming process using a CCP CVD device, pulse control is performed on a low-frequency RF power source, and high-temperature electrons are periodically suppressed before an arc discharge occurs, so as to avoid the arc discharge.

In an embodiment, the present invention provides a film-forming method using a CCP CVD device, in which an electric power is supplied to an electrode in the CCP CVD device intermittently through pulse control. During the pulse control, an ON time, which is when the electric power is supplied, and an OFF time, which is when the electric power supply is stopped, form one period, and the electric power supply is performed periodically.

The OFF time, which is when the electric power supply is stopped, is set in a time range between a lower limit time and an upper limit time, and the ON time, which is when the electric power is supplied, is set as the upper limit time.

The lower limit time for the OFF time, during which the electric power supply is stopped, is set as a time period from a moment that the electric power supply is stopped till a density of high-temperature electrons decreases to a plasma state incapable of causing an arc discharge.

If the electric power supply is stopped for a time period shorter than the lower limit time, the density of the high-temperature electrons does not sufficiently decrease to the plasma state incapable of causing an arc discharge; hence, an arc discharge may still occur when the electric power supply is resumed.

In another aspect, if the electric power supply is stopped for the lower limit time or a time period longer than the lower limit time, the density of the high-temperature electrons in the plasma decreases to the plasma state incapable of causing an arc discharge; hence, the occurrence of the arc discharge is suppressed when the electric power supply is resumed.

The upper limit time for the OFF time, during which when the electric power supply is stopped, is set as a time period from the moment that the electric power supply is stopped till the electron density decreases to a degree that is difficult to maintain the plasma. The time period is determined by a time that the high-temperature electrons reach a residual plasma threshold capable of maintaining the boundary of the plasma according to a relation between the electron density in the plasma and the OFF time when the electric power supply is stopped.

If the electric power supply is stopped for a time period exceeding the upper limit time, the electron density in the plasma decreases, and it is difficult to maintain the plasma.

In another aspect, if the electric power supply is stopped for the upper limit time or a time period shorter than the upper limit time, the electron density in the plasma may not be lower than the residual plasma threshold; hence, the plasma is maintained, and the film-forming process can be continuously performed by merely resuming the supply of the electric power.

The upper limit time for the ON time, during which the electric power is supplied, is set as a time period from the moment that the electric power is supplied till the electron temperature rises to a degree that the density of the high-temperature electrons reaches a saturation value. The time period is determined by a time that is shorter than the time required when the density of the high-temperature electrons reaches a saturation value according to a relation between the density of the high-temperature electrons in the plasma and the ON time when the electric power is supplied.

If the electric power is supplied for a time period exceeding the upper limit time, the density of the high-temperature electrons in the plasma rises and it is easy to induce an arc discharge. In another aspect, if the electric power is supplied and lasts for the upper limit time or a time period shorter than the upper limit time, the density of the high-temperature electrons may not reach a saturation value, and the occurrence of the arc discharge during the electric power supply is suppressed.

Through the above pulse control, an RF electric power greater than the RF electric power in the prior art may be supplied without causing an arc discharge; hence, the deposition rate is increased, and the productivity is enhanced.

In the film-forming method using the CCP-CVD device according to the present invention, during the pulse control, the OFF time, during which when the electric power supply is stopped, is set in a range with 20 μsec as the lower limit time and 50 μsec as the upper limit time, the ON time, during which when the electric power is supplied, is set in a range with 1000 μsec as the upper limit time, and the low-frequency RF electric power of 150 KHz to 600 KHz is intermittently supplied under the above conditions.

Moreover, in an embodiment, the present invention provides a plasma CVD device, which includes a film-forming chamber, provided with an RF electrode inside, for forming a thin film through plasma CVD on a substrate arranged opposite to the RF electrode; an RF power source, for supplying a low-frequency RF electric power to the RF electrode; and a pulse control portion, for controlling the electric power supply provided by the RF power source for the RF electrode.

The RF power source outputs a low-frequency RF electric power of 150 KHz to 600 KHz. Under conditions that an OFF time is in a range of 20 μsec to 50 μsec and an ON time is smaller than or equal to 1000 μsec, the pulse control portion performs pulse control on the low-frequency RF electric power, so as to form an intermittent pulse power.

When a nitride film of a crystalline solar cell is formed by using the CCP CVD device, a temperature of a substrate in a CVD process is set to be greater than or equal to 400° C. In the film-forming chamber, the temperature of the substrate in the CVD process is made to be greater than or equal to 400° C., so as to form a nitride film of a crystalline solar cell on the substrate.

EFFECT OF THE INVENTION

In the plasma film-foaming method and the plasma CVD device of the present invention, when the CCP device using a low-frequency RF power source is adopted to form a nitride film of a crystalline solar cell, the nitride film is formed on a substrate without causing any arc discharge.

Particularly, in the plasma film-forming method and the plasma CVD device of the present invention, high-temperature electrons are periodically suppressed before an arc discharge occurs, so as to avoid an arc discharge.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
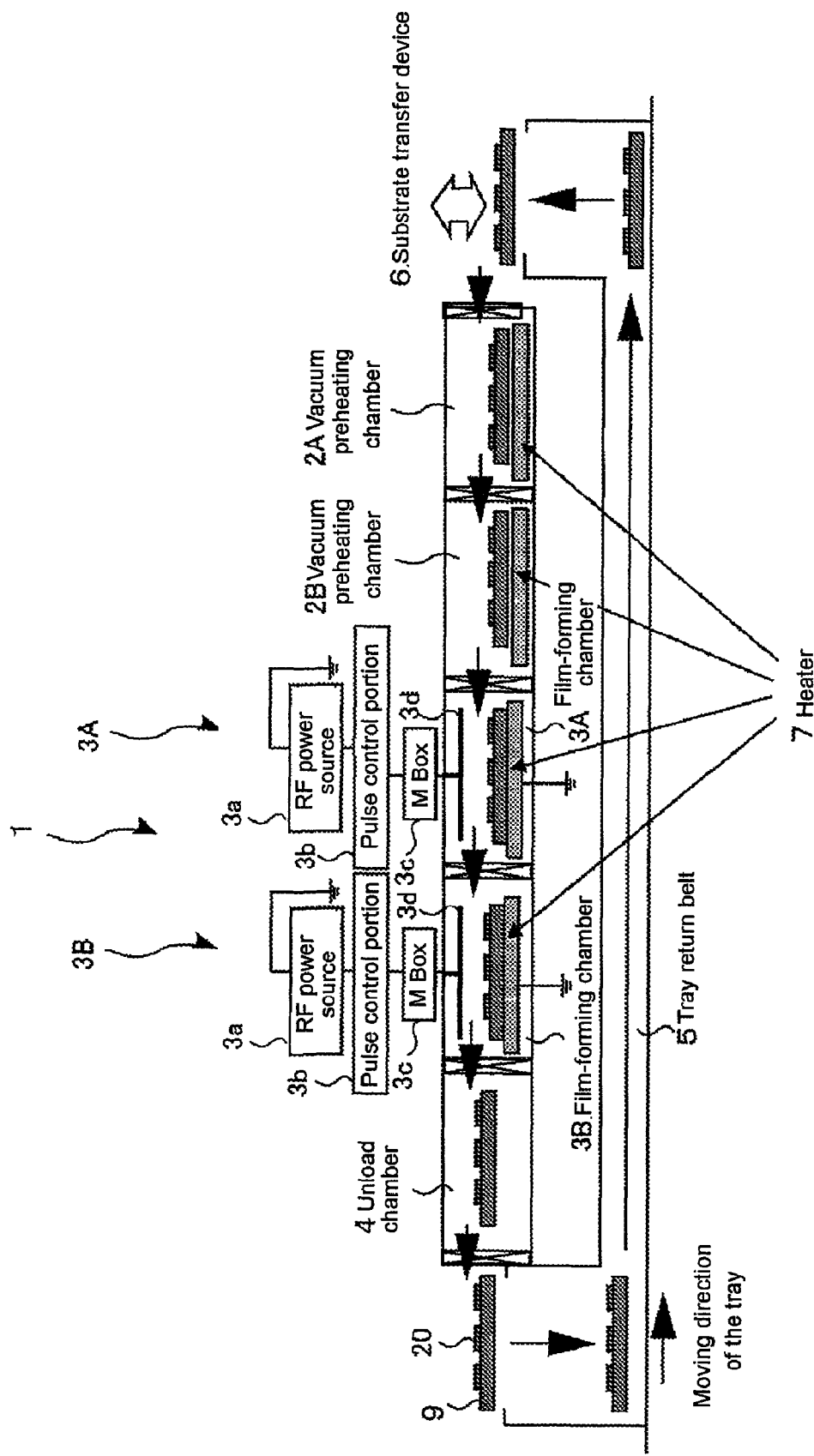
FIG. 1 is a schematic structural view of a plasma CVD device according to the present invention.

Reference will now be made in detail to the present embodiments of the invention, examples of which are illustrated in the accompanying drawings. Wherever possible, the same reference numbers are used in the drawings and the description to refer to the same or like parts.

Embodiments of the present invention are illustrated in detail below with reference to the accompanying drawings.

FIG. 1 is a schematic structural view of a plasma CVD device according to the present invention. The plasma CVD device exemplified in FIG. 1 has an in-line configuration.

Referring to FIG. 1, a plasma CVD device 1 includes a preheating chamber 2 (2A, 2B), a film-forming chamber 3 (3A, 3B), and an unload chamber 4 arranged in line. In the device, a substrate 20 loaded on a tray 9 is delivered while being preheated, so as to form a film thereon. After being removed from the unload chamber 4 and unloading the substrate 20 with a film formed thereon, the tray 9 is returned to a substrate transfer device 6 via a tray return belt 5. The tray 9 is once again loaded with an unprocessed substrate 20 and the loaded substrate 20 on the tray 9 is guided into the preheating chamber 2 for further processing.

The unprocessed substrate 20 is loaded on the tray 9 (receptor), which is mainly formed by carbon, and is guided into the preheating chamber 2 via the substrate transfer device 6. In the exemplified configuration in FIG. 1, the preheating chamber 2 is formed with the preheating chamber 2A and the preheating chamber 2B connected in series. In the preheating chambers 2A and 2B, for example, heaters 7 are provided in vacuum chambers.

The tray 9 guided into the preheating chambers 2A and 2B is heated by the heaters 7, and is controlled at a temperature suitable for performing the CVD process in the film-forming chamber 3. The heaters 7 are respectively disposed in the preheating chambers 2A and 2B, and the temperature control is easily adjusted through the heating operation in two sections. For example, the temperature is first raised rapidly by the heater 7 in the preheating chamber 2A, and then adjusted to a specific temperature by the heater 7 in the preheating chamber 2B.

Moreover, in the preheating chambers 2A and 2B, an introducing mechanism (not shown) is disposed for introducing a hydrogen gas or a helium gas into the vacuum chambers. The hydrogen gas having an excellent thermal conductivity is introduced into the preheating chambers 2A and 2B during the heating process, so that the heating efficiency is improved, the processing time is reduced, and the heating devices are simplified. Besides, the helium gas is introduced into the preheating chambers 2A and 2B to perform the temperature control.

The tray 9 and the substrate 20 heated in the preheating chamber 2 are guided into the film-forming chamber 3. In the exemplified configuration in FIG. 1, the film-forming chamber 3 is formed by the film-forming chamber 3A and the film-forming chamber 3B connected in series. In the film-forming chambers 3A and 3B, heaters 7 are provided in vacuum chambers.

The film-forming chambers 3A and 3B respectively have a high-frequency electrode 3d, which may be used for, for example, forming a SiN thin film by plasma CVD on a substrate being guided into the film-forming chambers 3A and 3B. Accordingly, a SiN reflective film is formed on a polysilicon substrate. The heaters 7 maintain a temperature suitable for performing the plasma CVD process.

Moreover, in the film-forming chambers 3A and 3B, an introducing mechanism (not shown) is disposed for introducing a hydrogen gas or a helium gas into the vacuum chambers.

The hydrogen gas having an excellent thermal conductivity is introduced into the film-forming chambers 3A and 3B during the heating process, so that the heating efficiency is improved, the processing time is reduced, and the heating devices are simplified. Besides, the helium gas is introduced into the film-forming chambers 3A and 3B to perform the temperature control.

Furthermore, in the film-forming chambers 3A and 3B, a film-forming process is carried out depending upon the actual requirements. Various embodiments may be adopted, for example, the film-forming processes of different thin films are performed in the film-forming chambers 3A and 3B, respectively, or the film-forming process for the same thin film is performed in the film-forming chambers 3A and 3B in two stages. In FIG. 1, two preheating chambers and two film-forming chambers are provided as an example, but the present invention is not limited thereto. In other embodiments, one chamber or three or more than three chambers may also be configured respectively.

Each high-frequency electrode 3d disposed in the film-forming chamber 3 is arranged opposite to an electrode (not shown) that supports the substrate 20 together with the tray 9, so as to foam the CCP CVD device. An RF power source 3a disposed on an external side of the vacuum chamber in the film-forming chamber 3 is used for supplying an RF electric power to the high-frequency electrode 3d. The RF power source 3a outputs a low-frequency RF electric power of 150 KHz to 600 KHz. The RF power source 3a is connected to a pulse control portion 3b, and supplies a low-frequency RF electric power, which has been pulse-controlled, to the high-frequency electrode 3d through a matching box 3c, so as to form the CCP.

The pulse control portion 3b performs controls to intermittently supply the low-frequency RF electric power, and repeats the time period that the electric power is supplied and the time period that the electric power supply is stopped, so as to intermittently supply the electric power to the high-frequency electrode 3d, instead of continuously supplying the electric power.

Figure 2:
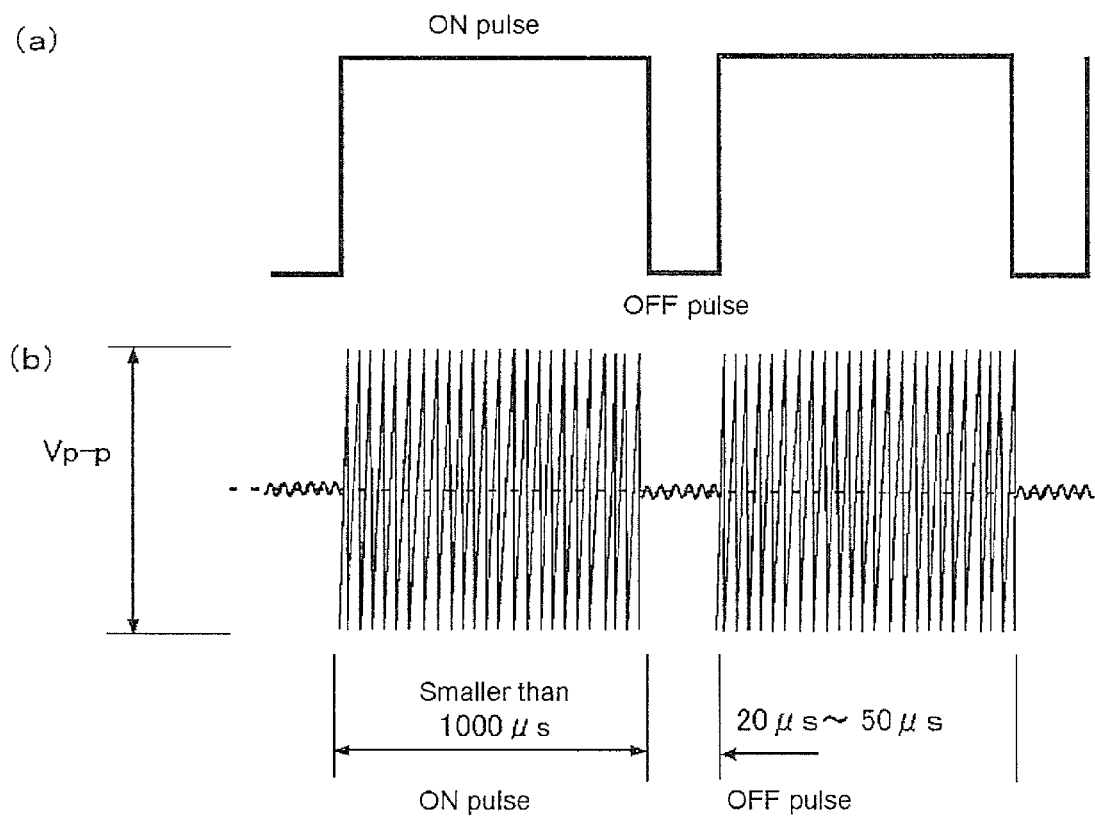
FIG. 2 is a pulse control diagram of an RF electric power, in which part (a) of FIG. 2 exemplifies a control pulse signal used for performing pulse control on the RF electric power, and part (b) of FIG. 2 exemplifies a waveform of an RF voltage after pulse control.

FIG. 2 is a pulse control diagram of an RF electric power, in which FIG. 2(a) exemplifies a control pulse signal used for performing pulse control on the RF electric power, and FIG. 2(b) exemplifies a waveform of an RF voltage after pulse control.

The control pulse signal is characterized in circulating an ON pulse and an OFF pulse. When the control pulse signal is in a time period of an ON pulse, the RF electric power output by the RF power source 3a is supplied to the high-frequency electrode 3d. In another aspect, in a time period of an OFF pulse (referred to as an OFF time below), the electric power supplied by the RF power source 3a to the high-frequency electrode 3d is stopped. Moreover, FIG. 2(b) shows that during the time period of the OFF pulse (referred to as an ON time below), the electric field is attenuated to a sufficient small degree that is incapable of generating a plasma.

FIG. 2 shows an example that the ON time is set to be smaller than or equal to 1000 μsec, and the OFF time is set in a range of 20 μsec to 50 μsec. The ON time and the OFF time are illustrated below.

In the pulse control of the present invention, during a process that a density of high-temperature electrons in the plasma decreases after the electric power supply is stopped, a time interval, which is between a time period (a lower limit time) from a moment that the electric power supply is stopped till the density of the high-temperature electrons decreases to a specific plasma state and a time period (an upper limit time) from the moment that the electric power supply is stopped till the electron density decreases to a residual plasma threshold capable of maintaining the boundary of the plasma, serves as the OFF time when the electric power supply is stopped; a time period, in which the density of the high-temperature electrons reaches a saturation value during a rising process of the density of the high-temperature electrons in the plasma after the electric power supply is started, serves as an upper limit of the ON time when the electric power is supplied; and the electric power is intermittently supplied under the above conditions of the ON time and the OFF time, so as to suppress an occurrence of an arc discharge.

Here, the so-called specific plasma state refers to a state in which the electrons at high-temperature areas sufficiently disappear and the arc discharge caused by the high-temperature electrons can be effectively suppressed and a state of the "so-called low-temperature plasma" is achieved.

Figure 3:
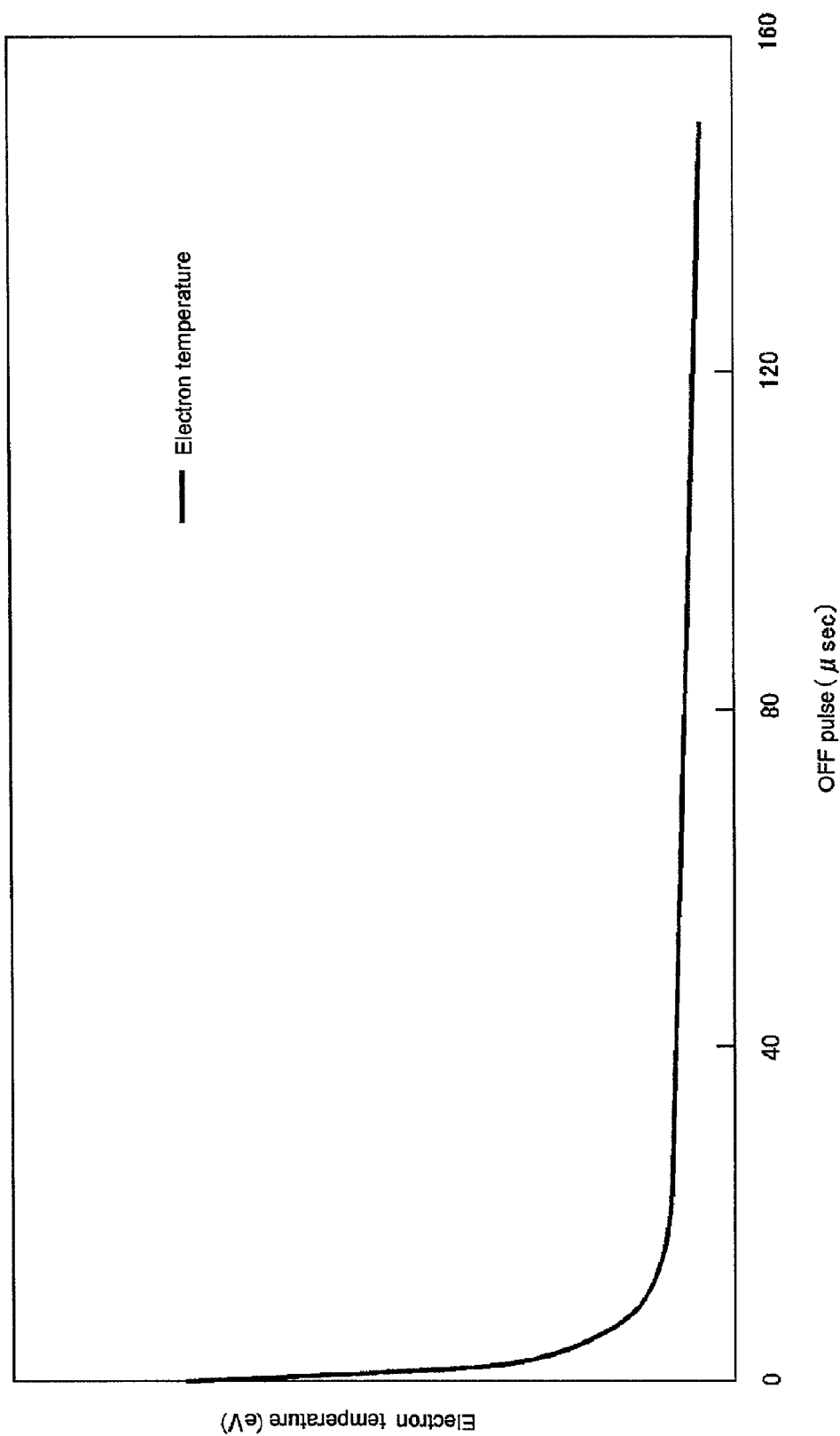
FIG. 3 is a diagram of electron temperature changes in a plasma after an electric power supply is stopped.
Figure 11:
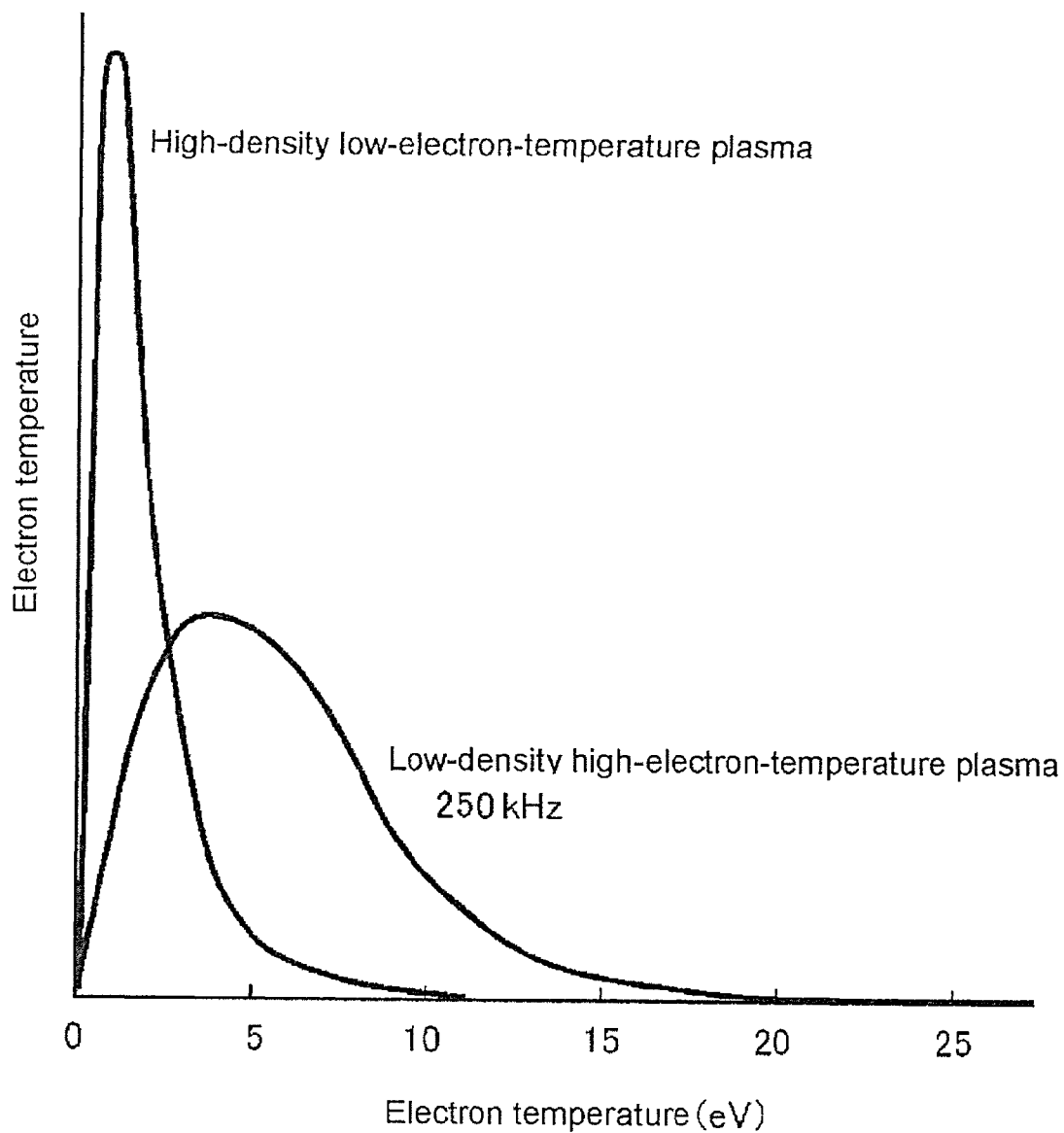
FIG. 11 is an energy distribution diagram of an electron temperature of a glow discharge plasma.

FIG. 11 shows an electron density distribution from low-temperature areas to high-temperature areas. As seen from the electron density distribution, with the elapse of time, the electrons in any one of the low-temperature areas and high-temperature areas may gradually disappear. Further, after a time period, the electron temperature is merely distributed in the low-temperature areas. FIG. 3 described later shows an integral quantity of an electron density at each time point and a mean electron temperature thereof. However, it can be derived that areas having a high electron density exist among areas that are greater than or equal to 50 eV not shown in FIG. 11.

Generally, in the electron density distribution, the temperature of each electron is not changed (lowered), but instead, an absolute number of the number of electrons in the areas classified by energy levels or temperature levels (electron density) is changed. Accordingly, the overall plasma is represented by a mean value of the electron temperature and is indicated by a low temperature or a high temperature.

Figure 4:
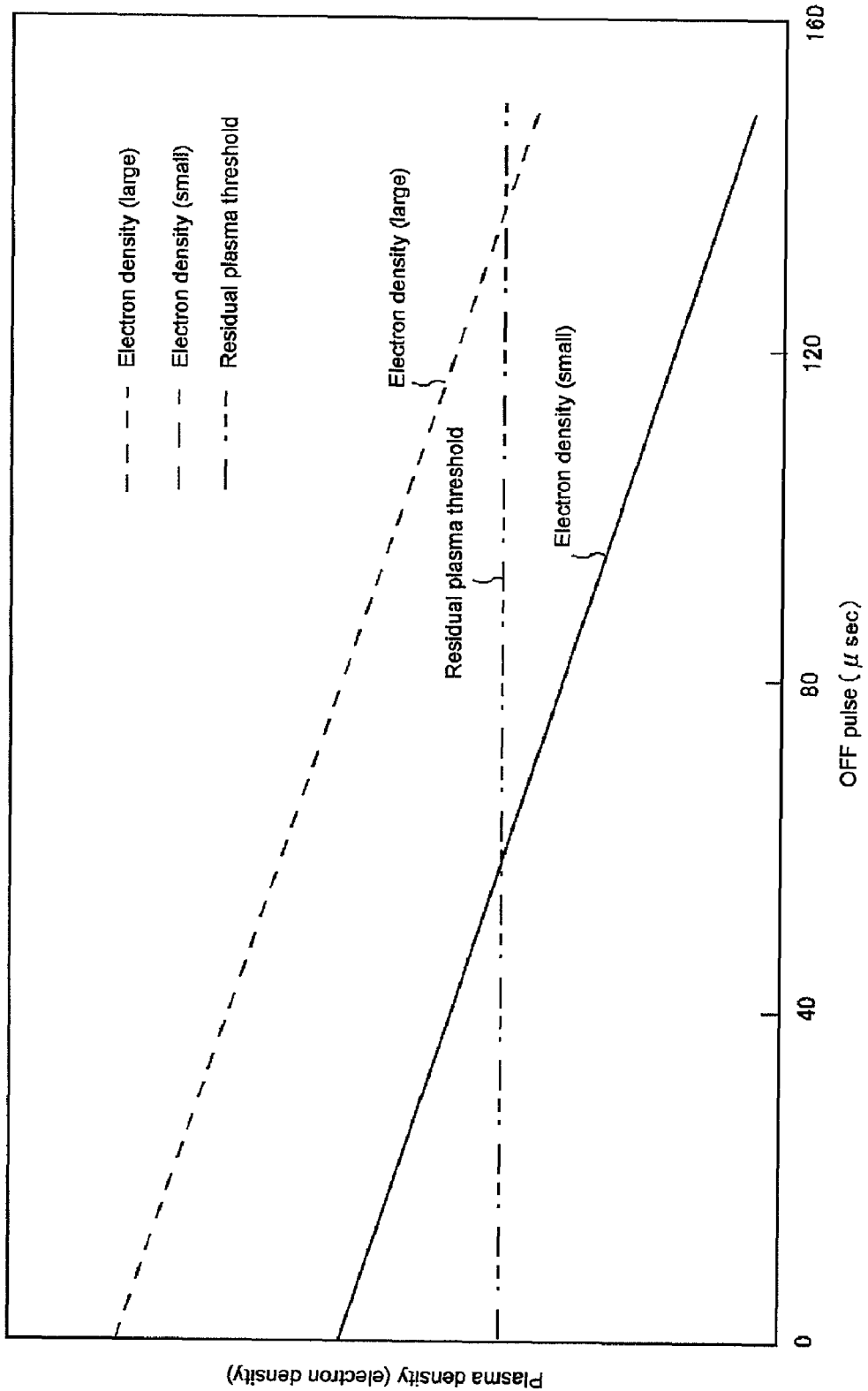
FIG. 4 is a diagram of electron density changes in a plasma after an electric power supply is stopped.
Figure 5:
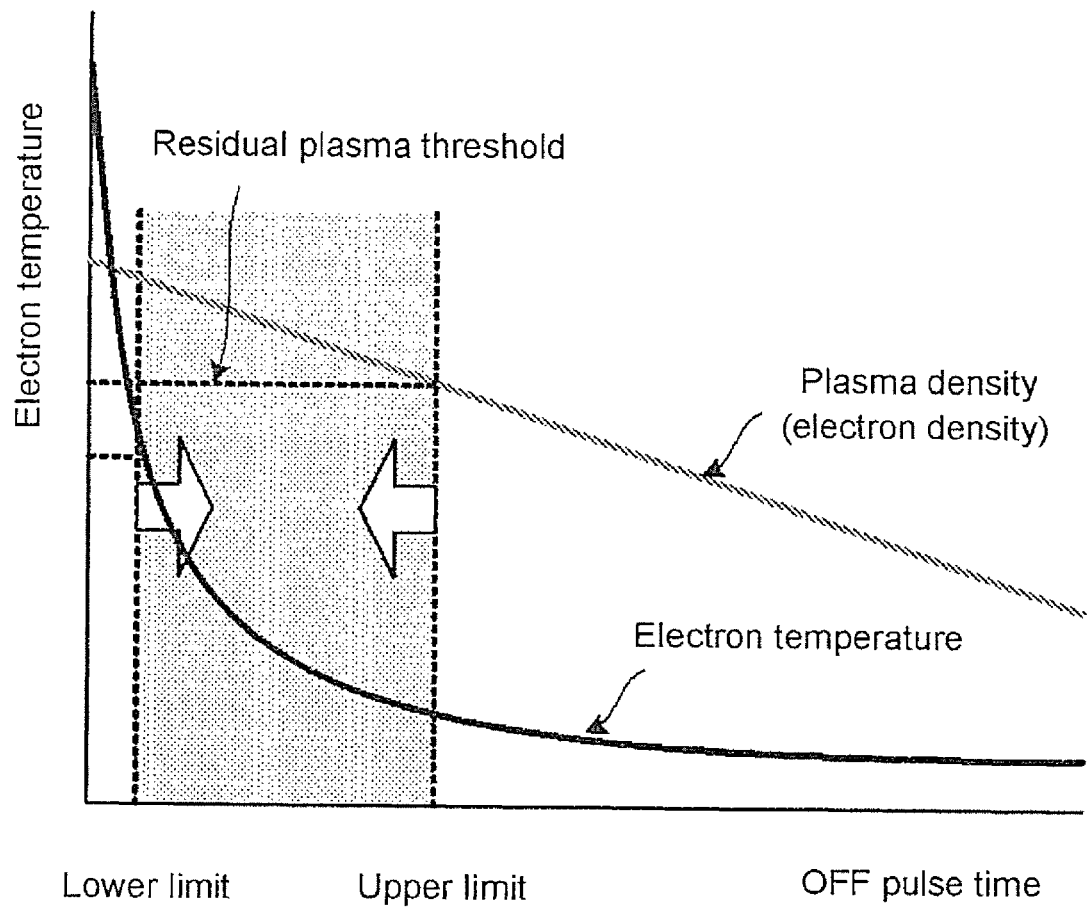
FIG. 5 is a diagram of an OFF time range determined by an electron density and an electron temperature according to the present invention.

FIGS. 3, 4, and 5 are diagrams illustrating the OFF time. FIG. 3 is a diagram of electron temperature changes in a plasma after an electric power supply is stopped. FIG. 4 is a diagram of electron density changes in a plasma after an electric power supply is stopped. FIG. 5 is a diagram of an OFF time range determined by an electron density and an electron temperature according to the present invention.

In order to suppress the occurrence of the arc discharge, the density of the high-temperature electrons in the plasma is required to be low. During the electron temperature changes in the plasma as shown in FIG. 3, after the RF power source is cut off, the electron temperature drops dramatically to reach a value of, for example, smaller than or equal to 2 eV. In FIG. 3, after the time period exceeds 20 μsec, the electrons in the plasma are mainly low-temperature electrons incapable of causing an arc discharge. Therefore, the time period from the moment that the electric power supply is stopped till the density of the high-temperature electrons reaches a specific plasma state is set as a lower limit of the OFF time for pulse control. According to the example in FIG. 3, 20 μsec is set as the lower limit of the OFF time.

Moreover, even if the RF electric power is cut off, the plasma still needs to be maintained. During the electron density changes in the plasma as shown in FIG. 4, after the RF electric power is cut off, the plasma density (electron density) substantially decreases linearly. In FIG. 4, the plasma density (electron density) decreases linearly from an initial plasma density In the residual plasma density after the RF electric power is cut off, a density capable of maintaining the boundary of the plasma serves as a residual plasma threshold (denoted by a chain line in FIG. 4). As long as the plasma density is greater than or equal to the residual plasma threshold, the plasma can be maintained. Once the electric power supply is resumed in this state, the plasma can be continued to be generated. On the contrary, if the plasma density is smaller than the residual plasma threshold, it is difficult to maintain the plasma. Therefore, the time period that the plasma density (electron density) reaches the residual plasma threshold is set as an upper limit, and the electric power supply is resumed before reaching the upper limit, so as to continue generating the plasma. In the present invention, a low-density high-electron-temperature plasma is generated by the plasma CVD device using a low-frequency RF power source, so that the upper limit of the OFF time is determined according to the electron density changes denoted by a solid line in FIG. 4. It can be seen from FIG. 4 that, the solid line denoting the electron density changes intersects with the line denoting the residual plasma threshold at about 50 μsec; hence, 50 μsec is set as the upper limit of the OFF time.

Moreover, the OFF time from the moment that the RF electric power is cut off till the plasma density decreases to the residual plasma threshold depends on the initial value of the plasma density, and the OFF time, which is when the initial value of the plasma density is large, is longer than the OFF time, which is when the initial value of the plasma density is small. In FIG. 4, the situation that the initial value of the plasma density is large is denoted by a dotted line, and the situation that the initial value of the plasma density is small is denoted by a solid line.

The lower limit of the OFF time determined in FIG. 3 and the upper limit of the OFF time determined in FIG. 4 are used to define an OFF time range for performing a pulse control on the RF electric power. FIG. 5 shows an OFF time range.

In FIG. 5, the OFF time for the pulse control on the RF electric power is set in a range between a lower limit and an upper limit as shown in FIG. 5. The lower limit is determined by the OFF time when the density of the high-temperature electrons is lower than a specific density, and the upper limit is determined by the OFF time when the plasma density (electron density) is lower than the residual plasma threshold.

Figure 6:
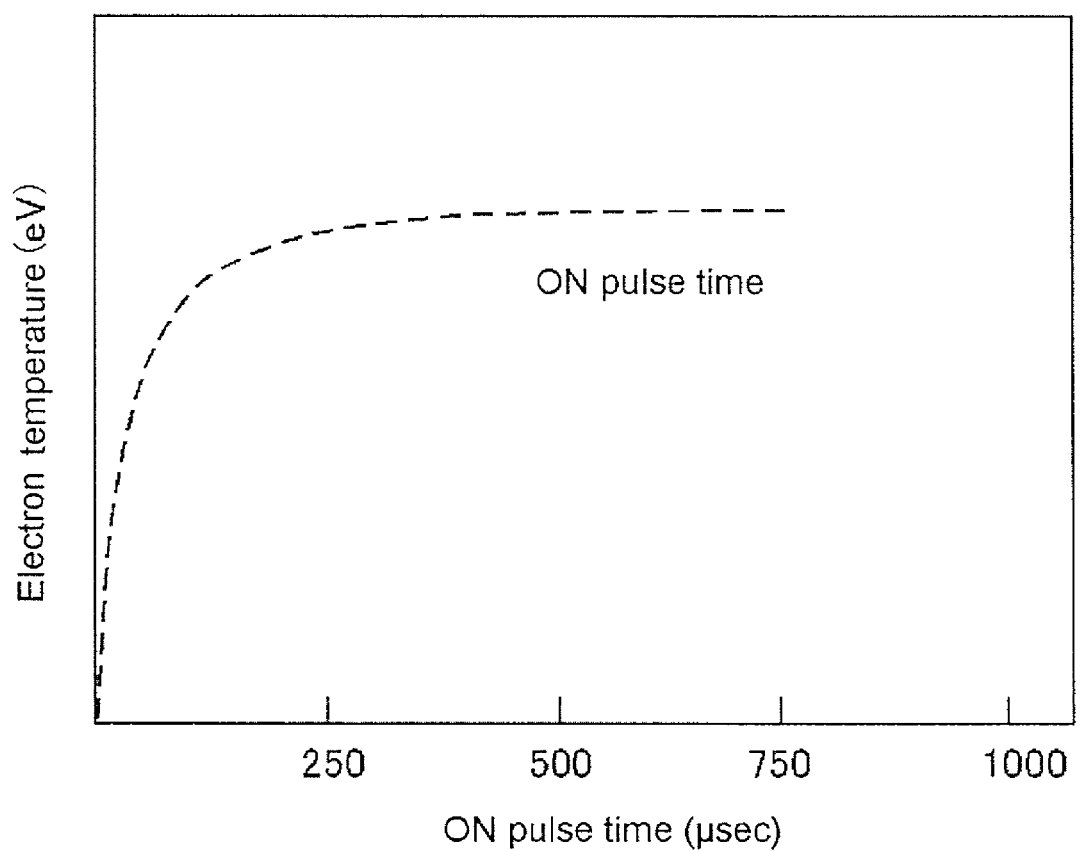
FIG. 6 is a diagram of an ON time according to the present invention.

FIG. 6 is a diagram illustrating an ON time, which indicates electron temperature changes in a plasma after an electric power supply has started. In FIG. 6, after the RF electric power is supplied, the electron temperature in the plasma slowly rises. If the high-temperature electrons in the plasma remain at a high density status for a long time, the probability of the existence of the high-temperature electrons is increased, and the probability of the occurrence of an arc discharge is increased as well. In this case, the saturation time that the density of the high-temperature electrons reaches a saturation value serves as a standard of the upper limit time, and the electric power supply is cut off before reaching the saturation time, so as to suppress the occurrence of the arc discharge. In FIG. 6, the saturation time that the density of the high-temperature electrons reaches a saturation value is set at 1000 μsec, so that 1000 μsec is set as the upper limit of the ON time.

Then, the deposition rate of the plasma CVD of the present invention is described in the following.

In order to raise the deposition rate, the supplied electric power must be increased. In the pulse control, the supplied electric power level is denoted by ON duty. The ON duty may be expressed in the following formula:

ON duty=ON time/(ON time+OFF time)

The deposition rate is directly proportional to the ON duty, so that the deposition rate can be increased by increasing the ON duty.

If merely the ON duty is increased, an arc discharge may occur. Thus, in the present invention, the ON duty is optimized to realize both the arc discharge suppression and the increase of the deposition rate.

Figure 7A:
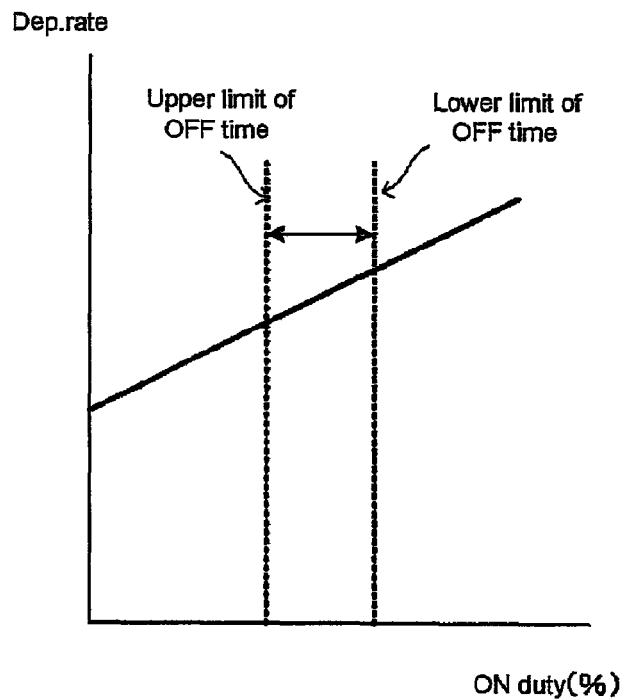
FIGS. 7(a) and 7(b) are diagrams illustrating a relation between ON duty and a deposition rate under pulse control according to the present invention.
Figure 7B:
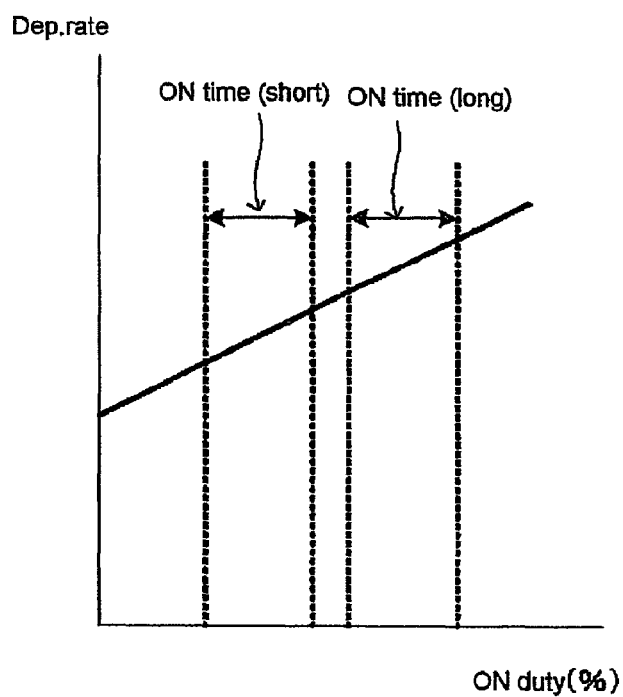

FIGS. 7(a) and 7(b) are diagrams illustrating a relation between ON duty and a deposition rate under pulse control, in which FIG. 7(a) shows a relation between the pulse control and the range of the OFF time, and FIG. 7(b) shows a relation between the pulse control and the range of the ON time. In addition, Dep.rate on a longitudinal axis in FIG. 7 denotes the deposition rate.

FIG. 7(a) indicates an ON duty range determined by the OFF time according to the relation between the deposition rate and the ON duty. The ON duty range shown in FIG. 7(a) satisfies the range defined by the upper limit and the lower limit of the OFF time for arc discharge suppression. The arc discharge can be suppressed and the deposition rate can be increased by using the maximum ON duty value in the ON duty range.

Moreover, FIG. 7(b) indicates a relation between a length of the ON time and the deposition rate based on the relation between the deposition rate and the ON duty. The ON duty range in FIG. 7(b) varies with the length of the ON time for arc discharge suppression. The longer the ON time is, the closer the ON duty range will approach the high side of the deposition rate.

Therefore, the ON duty is set by setting the OFF time as the lower limit and setting the ON time as the upper limit, so as to suppress the arc discharge and increase the deposition rate.

Figure 8:
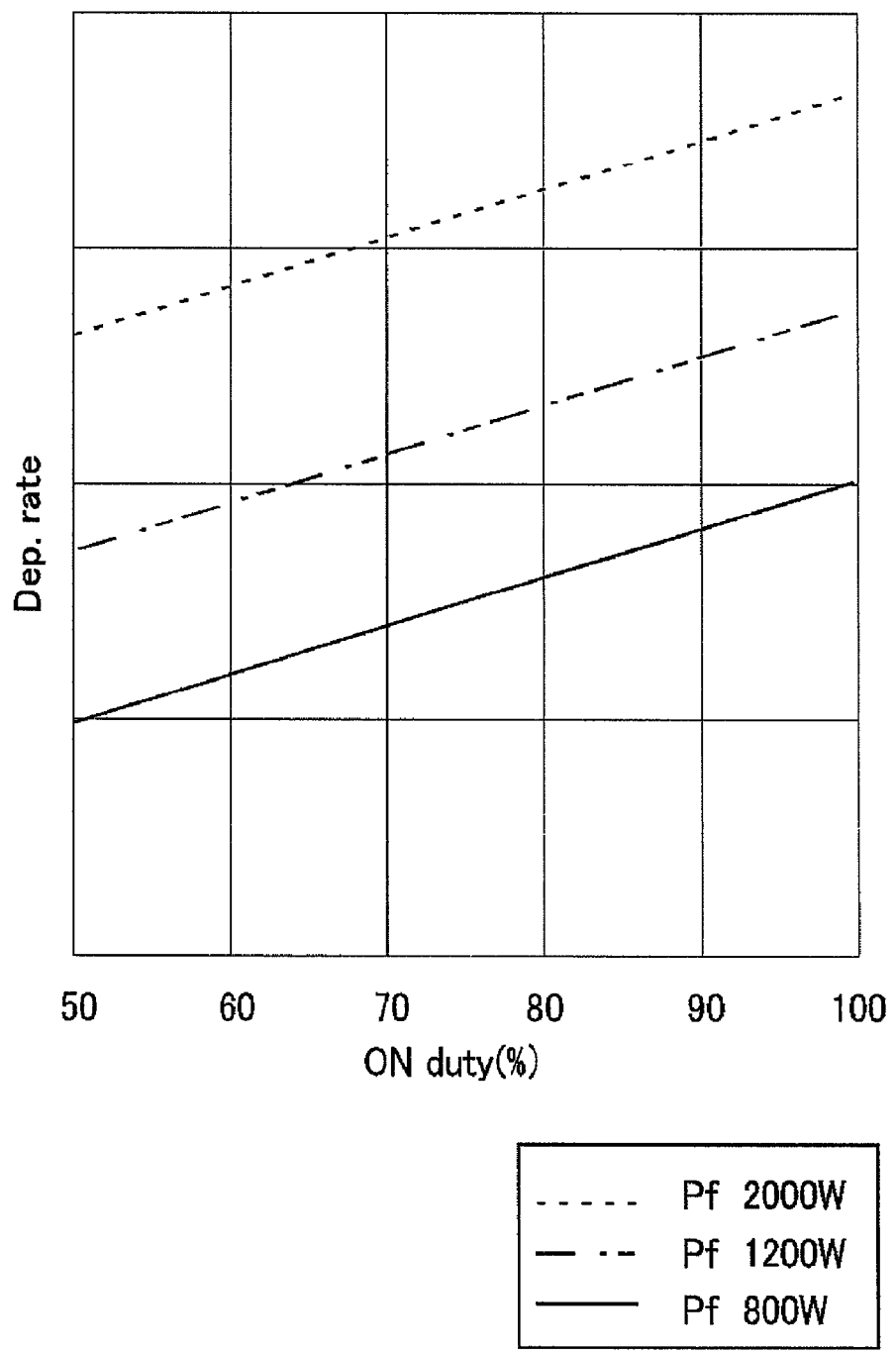
FIG. 8 is a diagram exemplifying a relation between ON duty and a deposition rate under pulse control according to the present invention.
Figure 9:
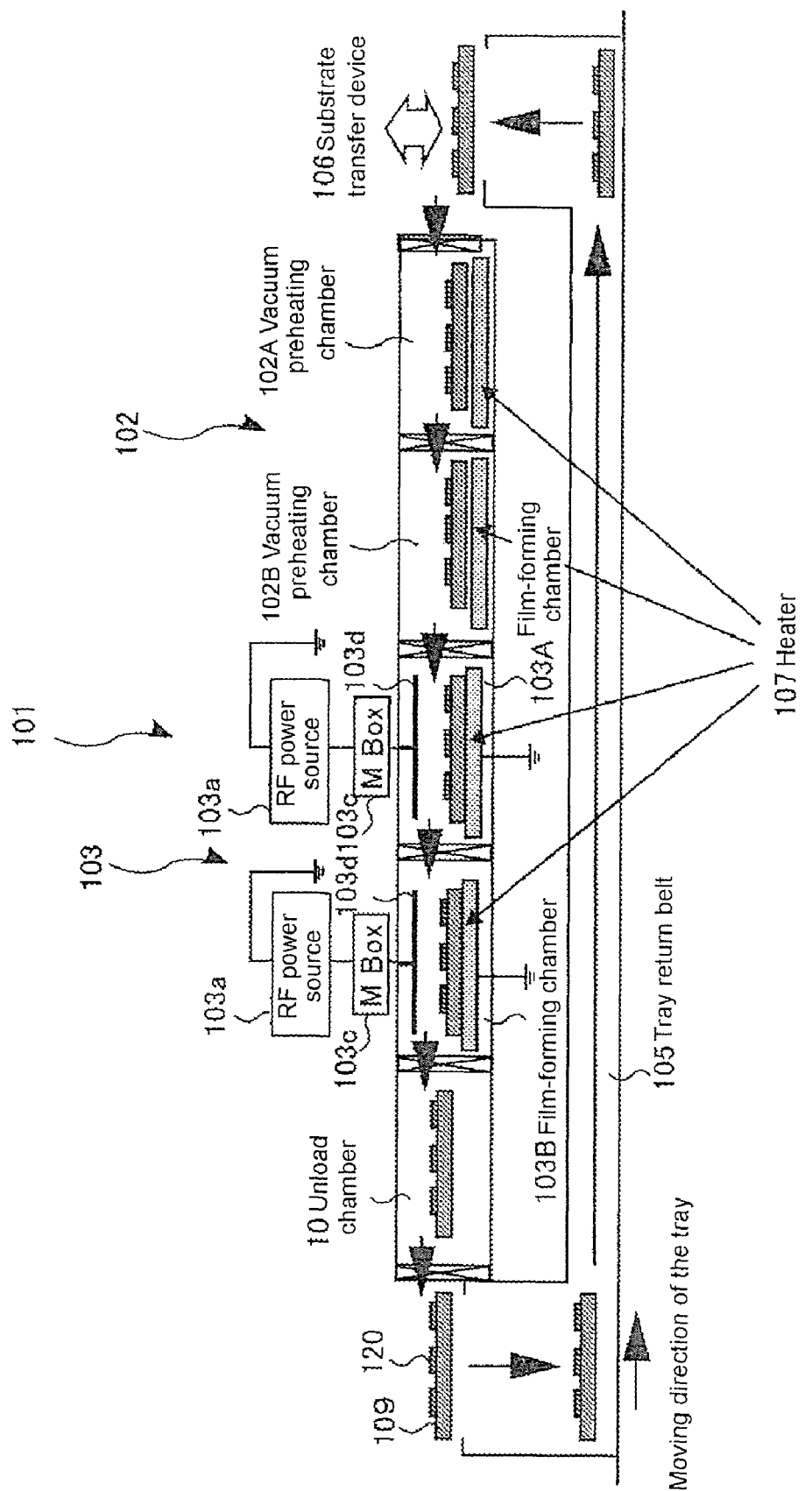
FIG. 9 is a diagram exemplifying a configuration of a CVD device having a vacuum chamber provided with a film-forming chamber and a heating chamber in the prior art.
Figure 10:
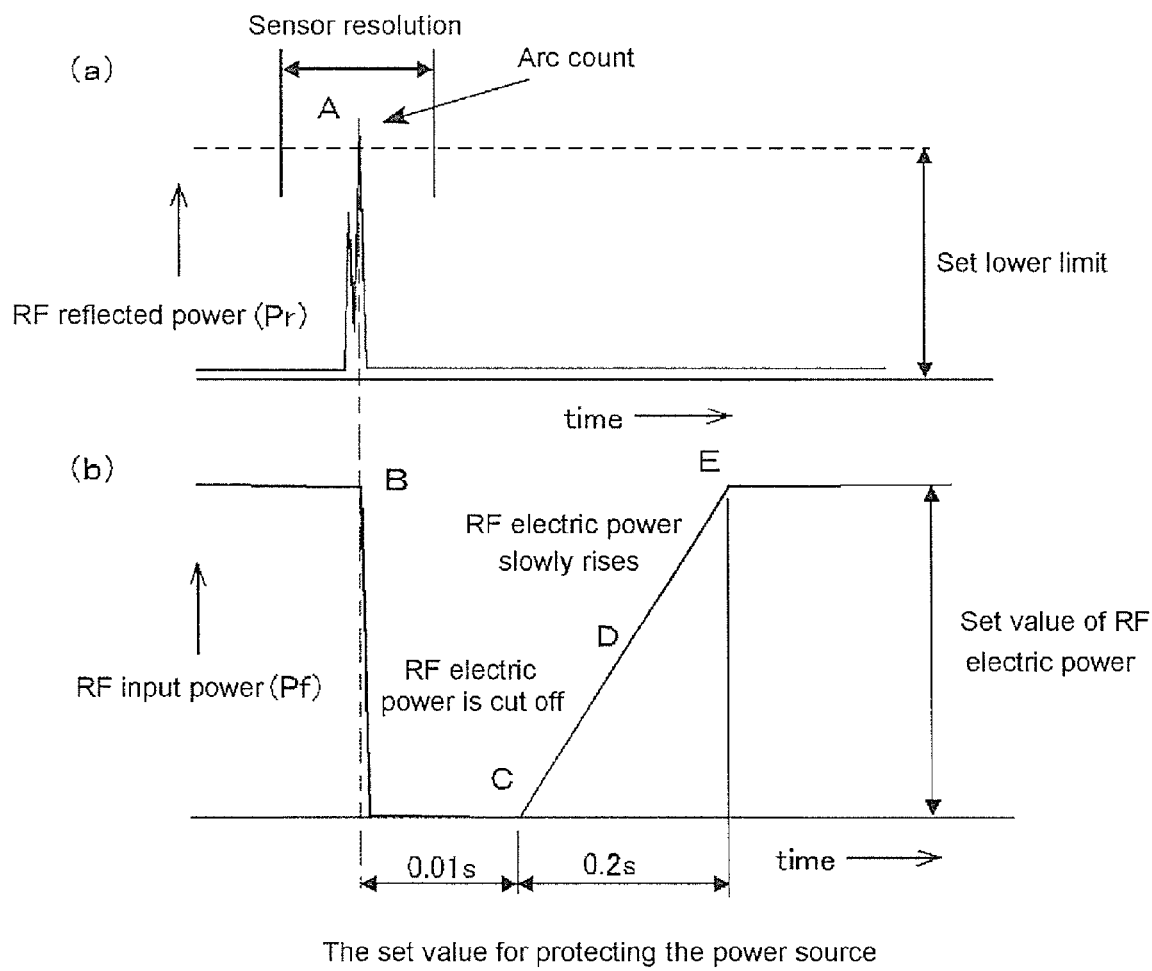
FIGS. 10(a) and 10(b) are diagrams showing the control of an arc discharge suppression in the prior art.

FIG. 8 is a diagram exemplifying a relation between a deposition rate and ON duty, at various input electric powers.

Referring to FIG. 8, the relations in various circumstances, which includes the input electric power is 800 W (denoted by a solid line in FIG. 8), the input electric power is 1200 W (denoted by a chain line in FIG. 8), and the input electric power is 2000 W (denoted by a dotted line in FIG. 8), are respectively described.

For example, when a threshold of the supplied RF electric power is set to 900 W, according to the present invention, even if a large RF electric power exceeds this threshold, the electric power may also be supplied without causing an arc discharge, so that the deposition rate is raised by increasing the supplied electric power.

According to the embodiments of the present invention, the pulse control of the RF electric power is optimised, so that the plasma can be generated without causing any arc discharge at all. Thus, the generation of the particles is suppressed, the uniformity of the thin film thickness is ensured, and damages to the substrate are avoided. Moreover, the peeling of the deposited film from the periphery portion is reduced, thereby prolonging the maintenance period of the plasma CVD device and enhancing the productivity.

In addition, in the prior art, the supplied RF electric power is limited in order to prevent the arc discharge, so that it is difficult to raise the deposition rate. However, in the present invention, due to the optimization of the RF electric power through pulse control, an RF electric power equal to or greater than the RF electric power in the prior art can be supplied, thereby significantly increasing the deposition rate and enhancing the productivity.

INDUSTRIAL APPLICABILITY

The present invention is not only applicable to thin films of solar cells, but also applicable to film-forming processes for forming films of different thickness on substrates. Moreover, the present invention can be used in a sputtering device, a CVD device, an ashing device, an etching device, a molecular beam epitaxy (MBE) device, an evaporation device, and the like.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A plasma film-forming method, using a capacitively-coupled plasma (CCP) chemical vapor deposition (CVD) device, the method comprising:
supplying an electric power to electrodes in the CCP CVD device intermittently through a pulse control, wherein the pulse control is characterized by alternating an Off time period and an ON time period, wherein
the OFF time period, during which the electric power supply is stopped, is in a range of 20 μsec to 50 μsec, and the ON time period, during which the electric power is supplied, is smaller than or equal to 1000 μsec, and a low-frequency radio-frequency (RF) electric power of 150 KHz to 600 KHz is intermittently supplied according to the pulse control, so as to suppress an occurrence of an arc discharge.

2. The plasma film-forming method according to claim 1, wherein when a nitride film of a crystalline solar cell is formed by using the CCP CVD device, a temperature of a substrate in a CVD process is greater than or equal to 400° C.

3. A plasma chemical vapor deposition (CVD) device, comprising:
a film-forming chamber, provided with a radio frequency (RF) electrode therein, for forming a thin film through plasma CVD on a substrate arranged opposite to the RF electrode;
an RF power source, for supplying a low-frequency RF electric power to the RF electrode; and
a pulse control portion, for controlling the supply of the low-frequency RF electric power by providing an OFF time period and an ON time period alternately to the RF power source, wherein
the RF power source outputs a low-frequency RF electric power of 150 KHz to 600 KHz, and
the OFF time period is in a range of 20 μsec to 50 μsec and the ON time period is smaller than or equal to 1000 μsec, the pulse control portion performs a pulse control on the low-frequency RF electric power to form an intermittently pulsated electric power, so as to suppress an occurrence of an arc discharge.

4. The plasma CVD device according to claim 3, wherein in the film-forming chamber, a temperature of the substrate in a CVD process is greater than or equal to 400° C., so as to form a nitride film of a crystalline solar cell on the substrate.

* * * * *